United States Patent
Mori et al.

(10) Patent No.: US 8,035,178 B2
(45) Date of Patent: Oct. 11, 2011

(54) SOLID-STATE IMAGING DEVICE

(75) Inventors: Mitsuyoshi Mori, Kyoto (JP); Yasuhiro Shimada, Kyoto (JP); Takuma Katayama, Kyoto (JP); Kenji Taniguchi, Osaka (JP); Masayuki Furuhashi, Osaka (JP)

(73) Assignee: Panasonic Corporation, Osaka (JP)

( * ) Notice: Subject to any disclaimer, the term of this patent is extended or adjusted under 35 U.S.C. 154(b) by 94 days.

(21) Appl. No.: 12/377,312

(22) PCT Filed: Jun. 24, 2008

(86) PCT No.: PCT/JP2008/001634
§ 371 (c)(1),
(2), (4) Date: Feb. 12, 2009

(87) PCT Pub. No.: WO2009/019813
PCT Pub. Date: Feb. 12, 2009

(65) Prior Publication Data
US 2010/0133592 A1    Jun. 3, 2010

(30) Foreign Application Priority Data
Aug. 9, 2007  (JP) .................. 2007-208042

(51) Int. Cl.
*H01L 27/142* (2006.01)
(52) U.S. Cl. .................. 257/432; 257/444; 257/446
(58) Field of Classification Search .......... 257/431–448, 257/E31.003
See application file for complete search history.

(56) References Cited

U.S. PATENT DOCUMENTS

| 6,537,895 | B1 |  | 3/2003 | Miller et al. |
| 7,285,482 | B2 |  | 10/2007 | Ochi |
| 7,750,423 | B2 | * | 7/2010 | Yokoyama .................. 257/431 |
| 2006/0141655 | A1 |  | 6/2006 | Tamura et al. |
| 2007/0023801 | A1 |  | 2/2007 | Hynecek |
| 2007/0194400 | A1 | * | 8/2007 | Yokoyama .................. 257/443 |

FOREIGN PATENT DOCUMENTS

| JP | 2001-015586 | 1/2001 |
| JP | 2003-318379 | 11/2003 |
| JP | 2006-186204 | 7/2006 |
| JP | 2006-222452 | 8/2006 |
| JP | 2006-294756 | 10/2006 |
| JP | 2007-036202 | 2/2007 |
| JP | 2008-060380 | 3/2008 |

* cited by examiner

*Primary Examiner* — Cuong Q Nguyen
(74) *Attorney, Agent, or Firm* — McDermott Will & Emery LLP

(57) ABSTRACT

A plurality of pixel portions (12) are formed on a silicon substrate (11). A photoelectric converter portion (10) constituting each of the pixel portions (12) is electrically isolated by an element isolation portion (13) comprising an insulating film formed on the silicon substrate (11). The photoelectric converter portion (10) partitioned by the element isolation portion (13) is so formed that a crystal orientation of the sides in contact with the element isolation portion (13) corresponds to a <00-1> direction. This makes it possible to reduce dark current caused by stress in the vicinity of the interface of the element isolation portion (13) and maintain high sensitivity even if the pixel portions (12) are made smaller in size.

11 Claims, 9 Drawing Sheets

FIG. 1
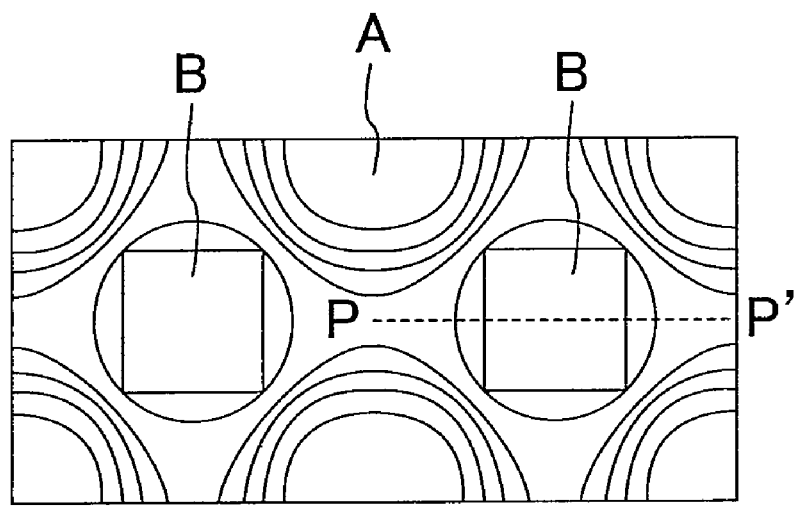
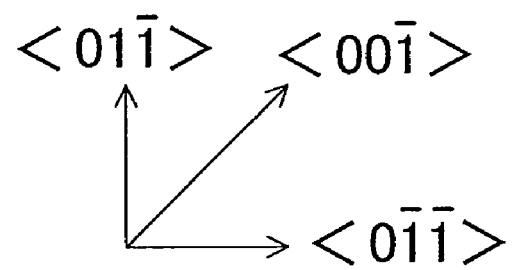

SOLID-STATE IMAGING DEVICE

RELATED APPLICATIONS

This application is the U.S. National Phase under 35 U.S.C. §371 of International Application No. PCT/JP2008/001634, filed on Jun. 24, 2008, which in turn claims the benefit of Japanese Application No. 2007-208042, filed on Aug. 9, 2007, the disclosures of which Applications are incorporated by reference herein.

TECHNICAL FIELD

The present invention relates to a solid-state imaging device having a plurality of pixel units formed on a silicon substrate.

BACKGROUND ART

A MOS solid-state imaging device is an image sensor that reads charge accumulated in a photodiode (photoelectric conversion section) by means of an amplifier circuit including a MOS transistor. In such a MOS solid-state imaging device, drive with low voltage and low power is allowed, and also pixel units each composed of a photodiode and the like arranged two-dimensionally, drive circuits (shift registers and the like) for driving MOS transistors in the pixel units and even a signal processing section for processing pixel signals detected in the pixel units can be formed on the same substrate. Hence, solid-state imaging devices of this type have been widely applied to image input devices and the like of mobile equipment.

In general, a photodiode constituting each pixel unit is electrically isolated with an element isolation section formed in a silicon substrate. A silicon oxide film and the like are formed on the surface of the photodiode, and this is likely to cause a dark current (charge generated in the dark time with no light illumination) due to a crystal defect occurring at the Si—SiO$_2$ interface. Hence, for the purpose of reducing the dark current occurring near the surface of the photodiode, a buried photodiode structure has normally been adopted in which a high-density impurity layer is formed on the surface of the photodiode.

In the element isolation structure for electrically isolating photodiodes and the like, downsizing of pixel units can be achieved by adopting LOCOS (local oxidation of silicon) isolation in place of the conventional PN junction isolation. In the LOCOS isolation, however, a dark current is likely to occur due to a crystal defect occurring at the LOCOS interface. Hence, a high-density impurity layer is further formed at the LOCOS interface in the silicon substrate to thereby reduce the dark current occurring near the LOCOS interface.

The above configuration however has the following problem. The effective open area of a photodiode defined with the LOCOS isolation is reduced with the high-density impurity layer formed at the LOCOS interface, and as a result, the sensitivity of the photodiode degrades.

To solve the above problem, Patent Document 1 describes a solid-state imaging device adopting STI (shallow trench isolation) as the element isolation structure.

FIG. 9 is a cross-sectional view showing a configuration of a photodiode isolated with STI. As shown in FIG. 9, the photodiode is composed of a p$^-$-type silicon layer 102 and an n-type silicon layer 103 formed in a silicon substrate 101, and is isolated with STI 104 formed in the silicon substrate 101. A p$^+$-type surface layer 105 is formed on the surface of the n-type silicon layer 103, and a p$^+$-type buried layer 106 is formed at the interface between the n-type silicon layer 103 and the STI 104, to thereby reduce a dark current occurring at these interfaces.

The STI 104 can be formed by forming a groove (concave portion) in the silicon substrate 101 and filling the groove with a silicon oxide film. The p$^+$-type buried layer 106 can be formed after formation of the groove by introducing an impurity into a portion of the silicon substrate 101 located on each side of the groove by slant ion implantation. The p$^+$-type buried layer 106 can therefore be thinned. Hence, the reduction in the effective open area of the photodiode can be minimized, and thus the sensitivity of the photodiode is suppressed from degrading along with the reduction in open area.

Patent Document 1: Japanese Laid-Open Patent Publication No. 2003-318379

Patent Document 2: Japanese Laid-Open Patent Publication No. 2006-186204

DISCLOSURE OF THE INVENTION

Problems to be Solved by the Invention

The adoption of STI as the element isolation structure can suppress degradation in the sensitivity of the photodiode caused by the formation of the p$^+$-type buried layer 106 as described above. Also, since the element isolation region can be made smaller than in the conventional LOCOS isolation, the STI structure is effective in miniaturization of pixel units.

However, in the STI, which is formed by first forming a groove in a silicon substrate and filling the groove with a silicon oxide different in thermal expansion coefficient from silicon, it is feared that stress may be induced near the STI in a heat treatment process after formation of the STI and this may cause a dark current.

The inventors of the present invention have examined the effect of stress induced near STI on a dark current and found the following.

FIG. 1 is a plan view showing the simulation result of distribution of stress in a silicon substrate observed when STI (region B) filled with a silicon oxide is formed in the silicon substrate (region A). Note that each contour line in FIG. 1 represents a stress distribution of the same magnitude. Calculation was made assuming that the STI is a square (each side: 2 µm) having a depth of 0.3 µm. The simulation was made using the first principles calculation.

As shown in FIG. 1, the STI-caused stress distribution is not uniform, but it is found that the rate at which the stress decreases according to the distance from the border of the STI greatly differs in the plane of the silicon substrate. More specifically, the stress decrease rate is smallest in the directions parallel with the sides of the square STI (equivalent to crystal orientations <01-1> and <0-1-1>), and is greatest in the directions parallel with the diagonals of the STI (equivalent to crystal orientation <00-1>).

For further confirmation of this phenomenon, stress along a line extending in parallel with a side of the STI including the center of the STI was simulated for the cases of placing the STI so that the crystal orientation of the side is <01-1> and so that it is <00-1>.

FIG. 2 shows the simulation results, in which (a) shows the result of the case of placement in the <01-1> direction and (b) shows the result of the case of placement in the <00-1> direction. From FIGS. 2(a) and 2(b), it is found that the stress decrease rate is greater in the <00-1> direction than in the <01-1> direction.

FIG. 3 is a view of relative comparison of the above results, obtained by plotting the stress in the silicon substrate (region A) with respect to the distance from the border of the STI (region B). As is found from FIG. 3, the stress in the <00-1> direction is almost half the stress in the <01-1> direction.

Such a large difference in the stress in the silicon substrate depending on the crystal orientation of a side of STI is considered to arise because the Young's modulus of the silicon substrate differs depending on the crystal orientation. More specifically, when the STI is placed so that the crystal orientation of its side is <00-1> low in Young's modulus, the stress in the silicon substrate is reduced compared with the case of placing the STI so that it is <01-1> high in Young's modulus.

Conventional MOS transistors are formed on a silicon substrate that has a principal plane whose crystal plane is (100) and a notch (or orientation flat) whose crystal orientation is <01-1>. This is due to the following reasons. A silicon oxide film formed on the (100) plane is small in the number of interface states, permitting formation of a gate oxide film small in leak current. Also, since the cleavage plane of the (100) silicon substrate is [110], scribe lines formed in directions parallel with and vertical to the <01-1> direction can be easily cut (this also has an advantage that since the channel of a MOS transistor is also in a direction equivalent to <01-1>, observation of the cross-sectional structure of the gate by cutting is easy). For these reasons, the substrate for forming MOS transistors has also been used in the conventional MOS solid-state imaging device (see Patent Document 2, for example). However, no consideration has conventionally been made on the crystal orientation in which a photodiode (photoelectric conversion section) defined with STI (element isolation section) is placed.

Based on the findings described above, a major object of the present invention is providing a solid-state imaging device capable of reducing a dark current caused by stress near the interface of STI (element isolation section) and also maintaining high sensitivity even though pixel units are miniaturized.

Means for Solving the Problems

The solid-state imaging device according to the present invention is a solid-state imaging device having a plurality of pixel units formed on a silicon substrate, wherein a photoelectric conversion section constituting each of the pixel units is electrically isolated by being surrounded with an element isolation section made of an insulating film formed in the silicon substrate, and the crystal orientation of a major side, among sides of a plane shape of the photoelectric conversion section defined with the element isolation section that are in contact with the element isolation section, is made equivalent to <00-1>.

With the above configuration, stress near the interface of the element isolation section can be reduced, and this permits reduction of a dark current occurring near the element isolation section. Also, for the purpose of reducing the dark current, a high-density impurity buried layer formed in a boundary region between the photoelectric conversion section and the element isolation section can be thinned, and this permits widening of the effective open area of the photoelectric conversion section. As a result, the sensitivity of the photoelectric conversion section is suppressed from degrading even though the pixel unit is miniaturized.

In a preferred embodiment, the plane shape of the photoelectric conversion section is a rectangle, and the crystal orientation of each side of the rectangle is equivalent to <00-1>.

In a preferred embodiment, a signal processing section for processing pixel signals detected in the pixel units is formed on the same silicon substrate, and the signal processing section comprises a MOS transistor including at least an n-channel MOS transistor, and the crystal orientation of a channel of the n-channel MOS transistor is made equivalent to <00-1>.

In a preferred embodiment, the photoelectric conversion section comprises a buried photodiode with a high-density impurity surface layer formed in a surface portion of the silicon substrate, and a high-density impurity buried layer of a same conductivity type as the high-density impurity surface layer is formed in a boundary region between the photoelectric conversion section and the element isolation section in the silicon substrate.

In a preferred embodiment, the element isolation section has a configuration that a groove formed in the silicon substrate is filled with the insulating film.

In a preferred embodiment, the photoelectric conversion section is formed in a predetermined region in the silicon substrate, the predetermined region having a distance between opposite portions of the element isolation section of 4 µm or less.

In a preferred embodiment, the pixel unit further includes a floating diffusion layer to which charge generated in the photoelectric conversion section is transferred, and the floating diffusion layer is electrically isolated with the element isolation section, and the crystal orientation of at least one side, among sides of a plane shape of the floating diffusion layer defined with the element isolation section that are in contact with the element isolation section, is made equivalent to <00-1>.

In a preferred embodiment, the plane shape of the floating diffusion layer is a rectangle, and the crystal orientation of each side of the rectangle is equivalent to <00-1>.

In a preferred embodiment, the pixel unit further includes a transfer transistor for transferring charge generated in the photoelectric conversion section to the floating diffusion layer, and the crystal orientation of a channel of the transfer transistor is made equivalent to <00-1>.

Effect of the Invention

According to the present invention, a solid-state imaging device capable of reducing a dark current caused by stress near the interface of the element isolation section and also maintaining high sensitivity even though the pixel unit is miniaturized can be implemented.

BRIEF DESCRIPTION OF THE DRAWINGS

FIG. 1 is a plan view showing a distribution of stress in a silicon substrate, presented in the problems to be solved by the invention.

DESCRIPTION OF REFERENCE NUMERALS

Figure 2A:
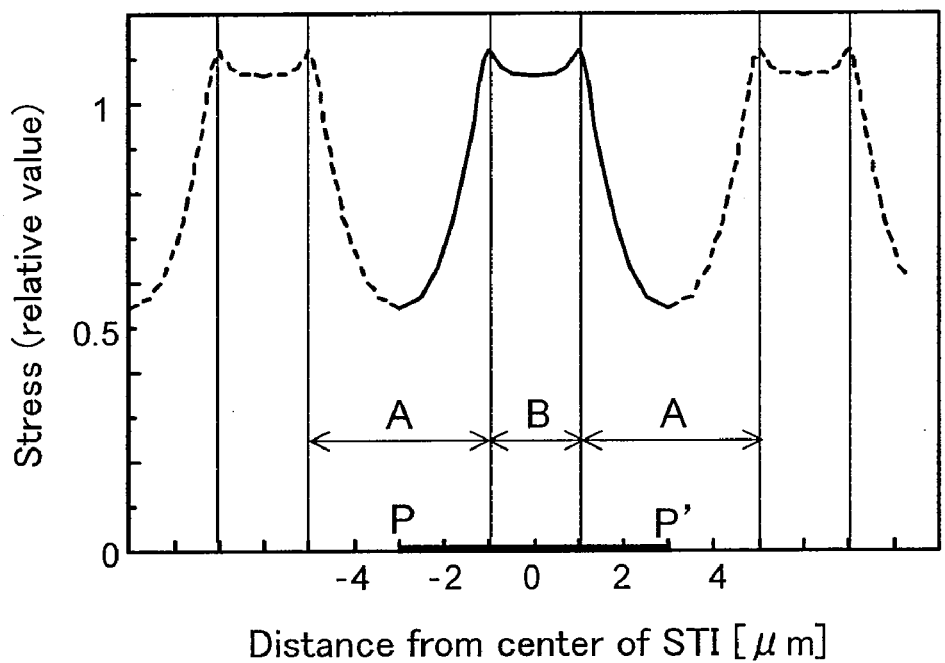
FIG. 2 shows stress distributions in crystal orientations, presented in the problems to be solved by the invention, in which (a) shows a stress distribution in the <01-1> direction and (b) shows a stress distribution in the <00-1> direction.

10 Photodiode (photoelectric conversion section)
11 N-type silicon substrate
12 Pixel unit
13 STI (element isolation section)
14 Floating diffusion layer
15 Transfer transistor
17 Notch
22 P-type silicon layer
23 N-type silicon layer
25 P$^+$-type surface layer (high-density impurity surface layer)
26 P$^+$-type buried layer (high-density impurity buried layer)
27 Pad insulating film
28 Oxidation resistant film
29 Groove
30 Sidewall oxide film
31 P-type silicon film
33 Reset transistor
34 Amplifier transistor
35 Selection transistor
36 Output pulse line
37 Output pulse line
38 Power supply
39 Output pulse line
40 Vertical output signal line
41 Imaging region
42 Vertical shift register
43 Horizontal shift register
44 Timing generation circuit
45 Output terminal
101 Silicon substrate
102 P$^-$-type silicon layer
103 N-type silicon layer
104 STI
105 P$^+$-type surface layer
106 P$^+$-type buried layer

BEST MODE FOR CARRYING OUT THE INVENTION

Hereinafter, an embodiment of the present invention will be described with reference to the relevant drawings. In the following drawings, components having substantially the same functions are denoted by the same reference numerals for simplification of description. It should be noted that the present invention is not limited to the embodiment to follow.

Figure 4:
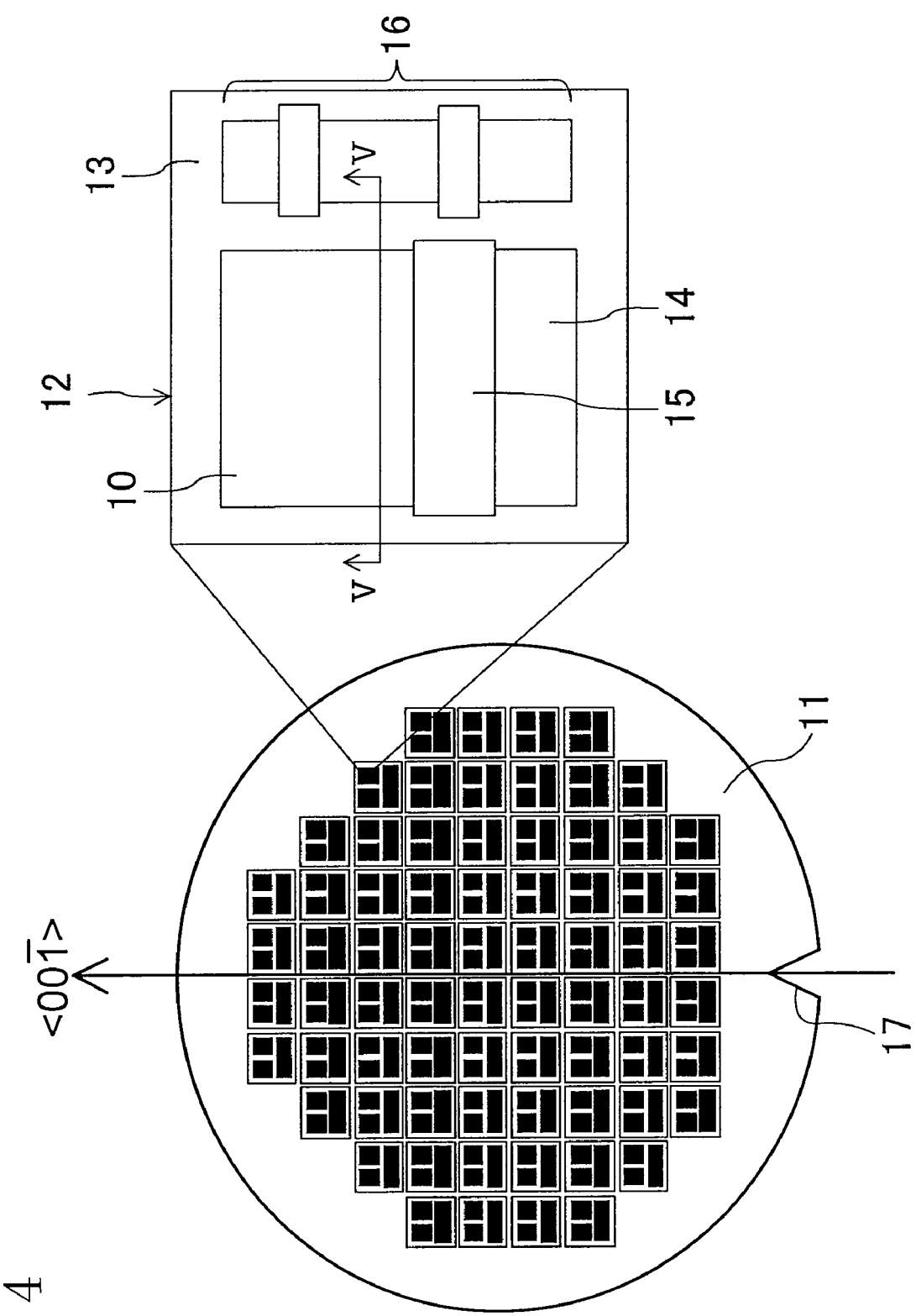
FIG. 4 is a plan view showing a configuration of a solid-state imaging device of an embodiment of the present invention.

FIG. 4 is a plan view showing a configuration of a solid-state imaging device of an embodiment of the present invention. As shown in FIG. 4, a plurality of pixel units 12 are formed on a silicon substrate 11. A photoelectric conversion section 10 constituting each pixel unit 12 is electrically isolated with an element isolation section 13 made of an insulating film formed in the silicon substrate 11. The photoelectric conversion section 10 defined with the eminent isolation section 13 is formed so that the crystal orientation of its side in contact with the element isolation section 13 is equivalent to <00-1>.

The crystal orientation of a side of the photoelectric conversion section 10 in contact with the element isolation section 13 can be made equivalent to <00-1> in the following manner, for example. The crystal orientation of a notch 17 of the silicon substrate 11 may be made equivalent to <00-1>. Assuming that the plane shape of the photoelectric conversion section 10 is a rectangle, the photoelectric conversion section 10 may be placed so that its side is parallel with the direction of the notch 17.

If the plane shape of the photoelectric conversion section 10 is a polygon other than a rectangle, the photoelectric conversion section 10 may be formed so that the crystal orientation of the longest side, among sides of the plane shape of the photoelectric conversion section 10 defined with the element isolation section 13 that are in contact with the element isolation section 13, is equivalent to <00-1>.

The pixel unit 12 also includes a floating diffusion layer 14 to which charge generated in the photoelectric conversion section 10 is transferred. The floating diffusion layer 14 is electrically isolated with the element isolation section 13. Like the photoelectric conversion section 10, the floating diffusion layer 14 defined with the element isolation section 13 is formed so that the crystal orientation of its side in contact with the element isolation section 13 is equivalent to <00-1>.

The pixel unit 12 further includes a transfer transistor 15 for transferring charge generated in the photoelectric conversion section 10 to the floating diffusion layer 14. The transfer transistor 15 is formed so that the crystal orientation of the channel thereof is equivalent to <00-1>.

Note that the "direction equivalent to <00-1>" refers to any of <00-1> direction, <0-10> direction, <001> direction and <010> direction.

Figure 5:
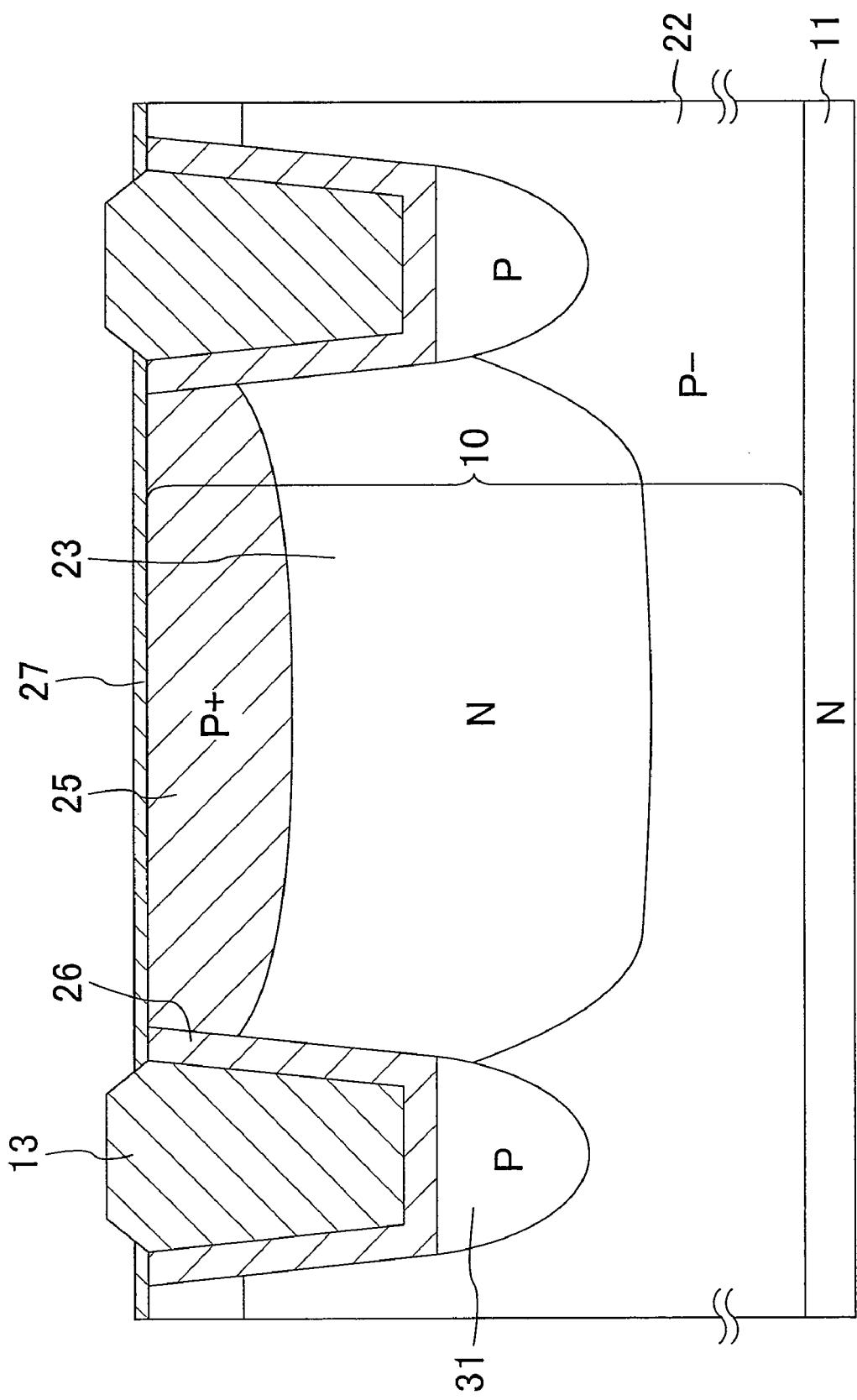
FIG. 5 is a cross-sectional view of the solid-state imaging device of the embodiment of the present invention.

FIG. 5 is a view showing a cross-sectional structure of the solid-state imaging device of the embodiment of the present invention, taken along line V-V in FIG. 4.

As shown in FIG. 5, the photoelectric conversion section 10 is composed of a buried photodiode (a p$^-$-type silicon layer 22 and an n-type silicon layer 23) with a p$^+$-type surface layer (high-density impurity surface layer) 25 formed in a surface portion of the n-type silicon substrate 11. Also, a p$^+$-type buried layer (high-density impurity buried layer) 26 having the same conductivity type as the p$^+$-type surface layer is formed in a boundary region between the photoelectric conversion section 10 and the element isolation section 13 in the silicon substrate 11.

The element isolation section 13 has such a configuration that a groove formed in the silicon substrate 11 is filled with an insulating film (STI structure, for example).

Next, a fabrication method for the solid-state imaging device of this embodiment will be described with reference to the step-by-step cross-sectional views in FIGS. 6(a) to 6(d).

Figure 6A:
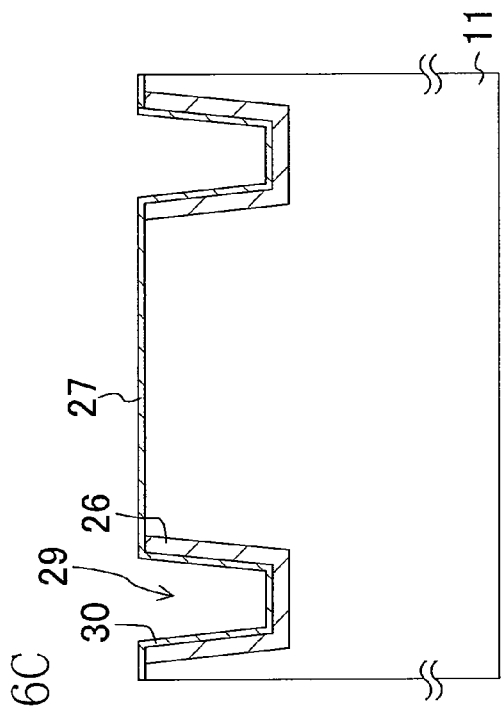
FIGS. 6(a) to 6(d) are cross-sectional views showing step by step a fabrication method for the solid-state imaging device of the embodiment of the present invention.

First, as shown in FIG. 6(a), on the n-type silicon substrate 11, formed are a pad insulating film 27 made of a silicon oxide film having a thickness of about 1 to 50 nm and then an oxidation resistant film 28 made of a silicon nitride film and the like having a thickness of 50 to 400 nm. The oxidation resistant film 28 and the pad insulating film 27 are then selectively etched to open an element isolation formation region.

Figure 6C:
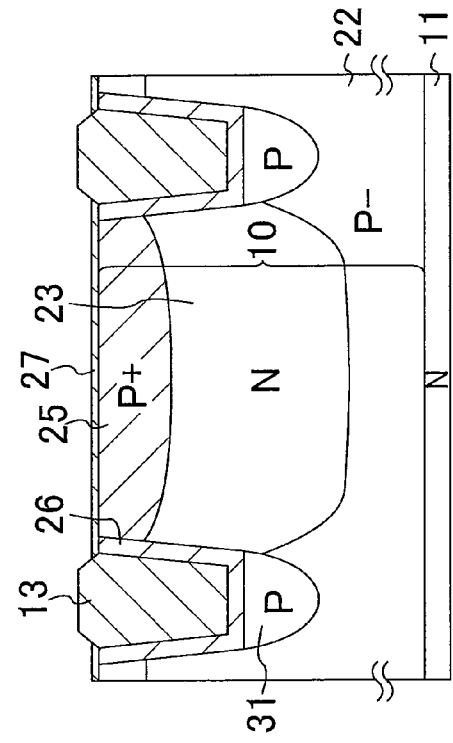
Figure 6B:
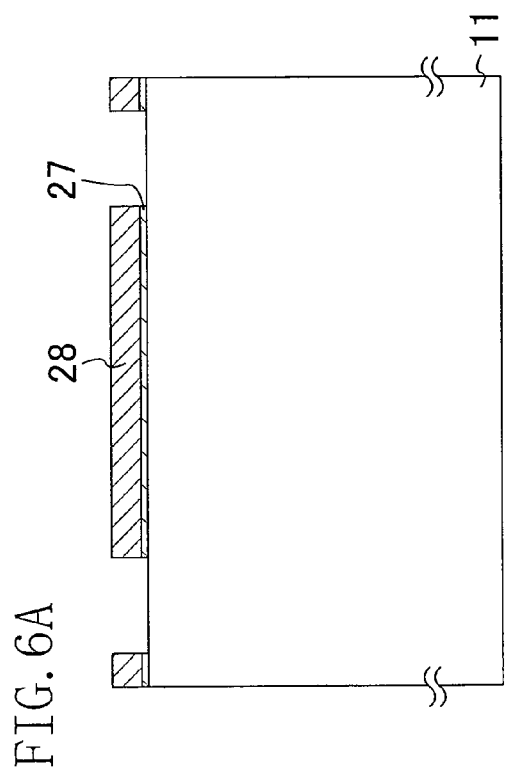

Thereafter, as shown in FIG. 6(b), the silicon substrate 11 is etched using the oxidation resistant film 28 as a mask to form a groove 29 having a depth of about 10 to 600 nm in the element isolation formation region.

As shown in FIG. 6(c), a sidewall oxide film 30 is formed on the side and bottom of the groove 29 by thermal oxidation, and then $BF_{2+}$ ions are implanted at an angle slanted by about 30° with respect to the substrate 11 to form the $p^+$-type buried layer 26 on the side and bottom of the groove 29. The ion implantation is performed under the conditions of an implantation energy of 2.0 KeV to 50 KeV and a dose of $1×10^{11}/cm^2$ to $1×10^{15}/cm^2$.

Figure 6D:
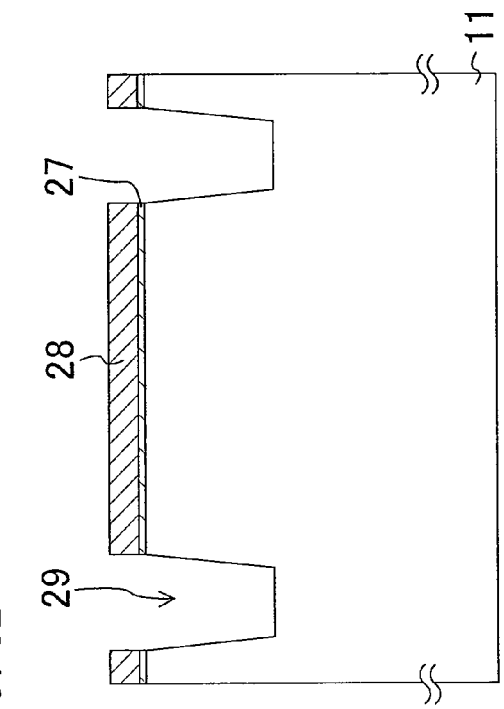

As shown in FIG. 6(d), the groove 29 is filled with an insulating film made of a silicon oxide and the like, and then the surface of the insulating film is flattened by CMP to form the element isolation section 13. Thereafter, the oxidation resistant film 28 and the pad insulating film 327 are removed by etching, and then the $p^-$-type silicon layer 22, the n-type silicon layer 23, the $p^+$-type surface layer 25 and a p-type silicon layer 31 are formed in respective predetermined regions of the silicon substrate 11 by ion implantation, to thereby complete the solid-state imaging device shown in FIG. 5.

In this embodiment, the photoelectric conversion section 10 defined with the element isolation section 13 is formed so that the crystal orientation of its side in contact with the element isolation section 13 is <00-1>. With this formation, the stress near the interface of the element isolation section 13 can be reduced, and hence the dark current occurring near the element isolation section 13 can be reduced. Also, for the purpose of reducing the dark current, the $p^+$-type buried layer 26 formed in the boundary region between the photoelectric conversion section 10 and the element isolation section 13 can be thinned, and hence the effective open area of the photoelectric conversion section 10 can be widened. As a result, the sensitivity of the photoelectric conversion section 10 is suppressed from degrading even though the pixel unit is miniaturized.

Figure 3:
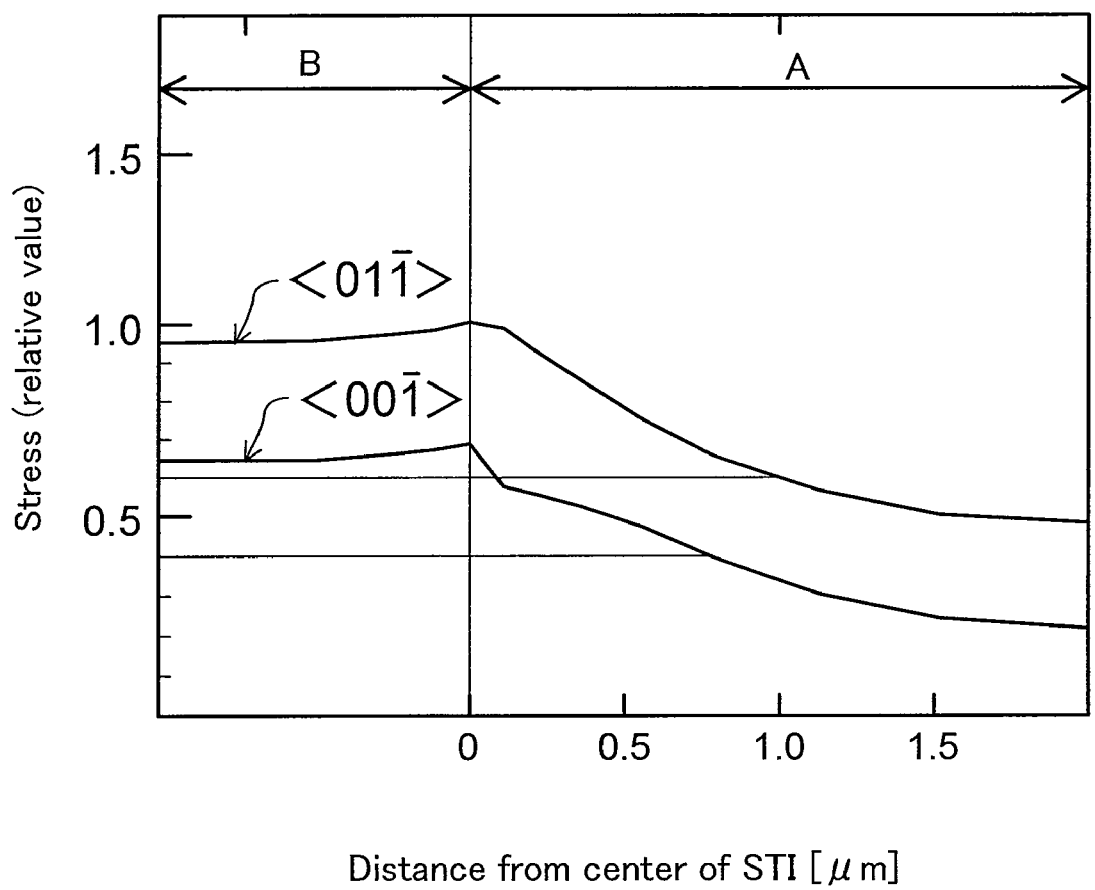
FIG. 3 is a view showing comparison of the stress distributions in the crystal orientations, presented in the problems to be solved by the invention.

For example, according to the comparison data shown in FIG. 3, when a side of the element isolation section is formed in the <01-1> direction, the stress at a distance of 1 μm from the border of the element isolation section is roughly the same as the stress at a distance of 0.1 μm from the border of the element isolation section observed when a side of the element isolation section is formed in the <00-1> direction. In other words, an effect equivalent to the dark current reduction effect obtained when the $p^+$-type buried layer 26 is formed with a thickness of 1 μm in the case of forming a side of the element isolation section in the <01-1> direction is obtained with formation of a 0.1 μm-thick $p^+$-type buried layer 26 in the case of forming a side of the element isolation section in the <00-1> direction. This indicates that the thickness of the $p^+$-type buried layer 26 can be reduced to a tenth or less of the conventional thickness.

For example, assuming that the circumference of the photoelectric conversion section defined with the element isolation section is 4 μm, the number of electrons accumulated in the photoelectric conversion section can be increased to about 1.8 times as large as that conventionally obtained by reducing the thickness of the $p^+$-type buried layer to one fifth. Likewise, assuming that the gate width of the transfer transistor and the floating diffusion layer is 4 μm, a charge accumulation and charge transfer effect equivalent to that conventionally obtained can be attained with about a half of the conventional width. Also, the narrow channel effect can be reduced. Hence, the pixel unit can be miniaturized, permitting high-resolution imaging. Moreover, when the pixel unit is so miniaturized that the area of the pixel unit becomes as small as about 1.4 $μm^2$, the circumference of the photoelectric conversion section will be about 2 μm. In this case, the number of electrons accumulated in the photoelectric conversion section will increase up to about three times.

Figure 7A:
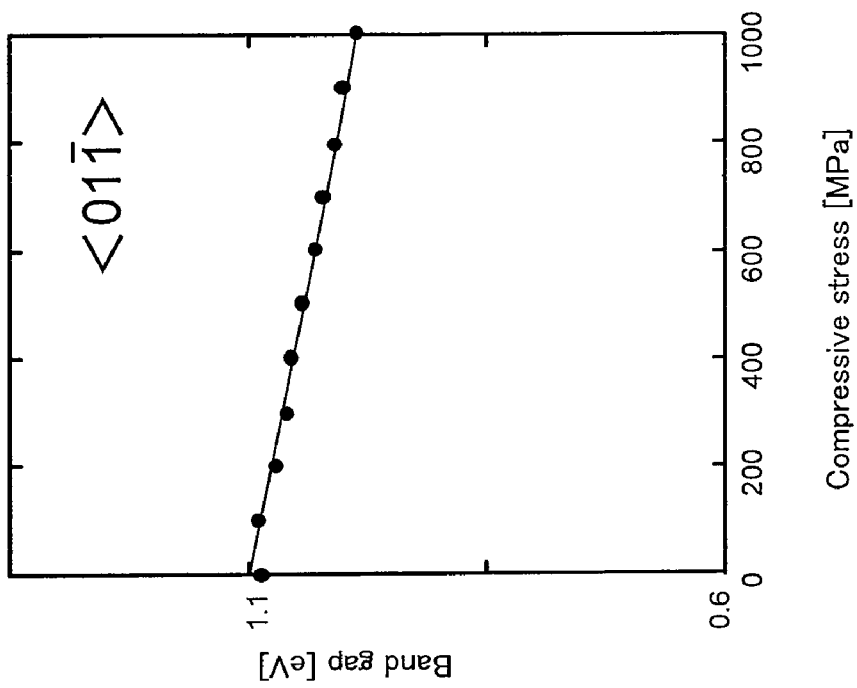
FIG. 7 shows changes in band gap with respect to the stress according to the present invention, in which (a) is a view showing a change in band gap in the <00-1> direction and (b) is a view showing a change in band gap in the <01-1> direction.
Figure 7B:
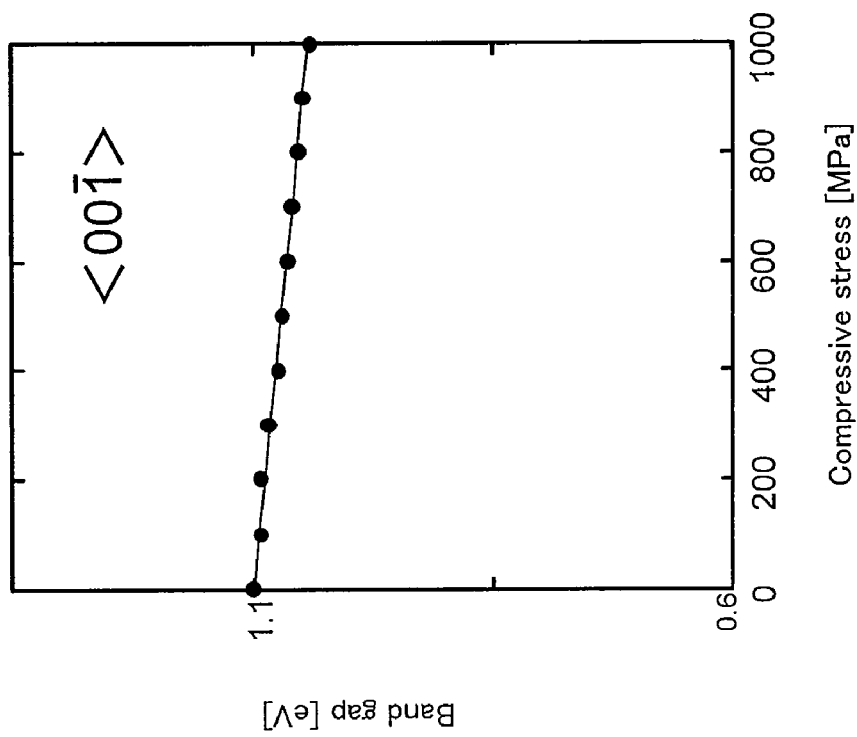

Incidentally, it is known that the stress-caused band gap narrowing of silicon is smaller in the <00-1> direction than in the <01-1> direction as shown in FIGS. 7(a) and 7(b). Hence, by forming a side of the element isolation section in the <00-1> direction, another effect can be obtained in which the magnitude of the dark current can be reduced by about 55% compared with the case of forming a side of the element isolation section in the <01-1> direction. This will be described in detail as follows.

A defect-induced dark current J caused by stress can be calculated by theoretical expression (1):

[Expression 1]

$$J \propto \frac{\sqrt{N_C N_V} \exp\left(-\frac{\varepsilon_g}{2k_B T}\right)}{2\tau} \tag{1}$$

In the above expression, Nc denotes the effective state density of the conduction band (1/$cm^3$), Nv denotes the effective state density of the valence band (1/$cm^3$), Eg denotes the band gap, $k_B$ denotes the Boltzmann constant, T denotes the temperature (K) and τ denotes the relaxation time.

Also, the band gap Eg of silicon under stress σ in the <00-1> direction and <01-1> direction can be respectively calculated by theoretical expressions (2) and (3):

[Expression 2]

$$E_{g<00T>} = 1.12 - 0.000062 * \sigma \tag{2}$$

[Expression 3]

$$E_{g<01T>} = 1.12 - 0.000113 * \sigma \tag{3}$$

Hence, from the expressions (1), (2) and (3) above, the ratio of the dark current $J_{<00-1>}$ occurring when a side of the element isolation section is in the <00-1> direction to the dark current $J_{<01-1>}$ occurring when a side of the element isolation section is in the <01-1> direction is calculated by expression (4):

[Expression 4]

$$\begin{aligned}\frac{J_{<00T>}}{J_{<01T>}} &\approx \frac{\exp\left(-\frac{\varepsilon_g - 0.000113\sigma}{2k_B T}\right)}{\exp\left(-\frac{\varepsilon_g - 0.000062\sigma}{2k_B T}\right)} \\ &= \frac{\exp\left(-\frac{\varepsilon_g}{2k_B T}\right)\exp\left(\frac{0.000113\sigma}{2k_B T}\right)}{\exp\left(-\frac{\varepsilon_g}{2k_B T}\right)\exp\left(\frac{0.000062\sigma}{2k_B T}\right)} \\ &\approx 1.8 \end{aligned} \tag{4}$$

That is, by forming a side of the element isolation section in the <00-1> direction, the magnitude of the dark current can be reduced by about 55% compared with the case of forming a side of the element isolation section in the <01-1> direction.

Note that as shown in FIG. 2(a), when a side of the element isolation section 13 is formed in the <01-1> direction as in the conventional case, the stress is not minimized for the photoelectric conversion section 10 (region A) whose distance between the opposite element isolation portions is 4 μm.

Figure 2B:
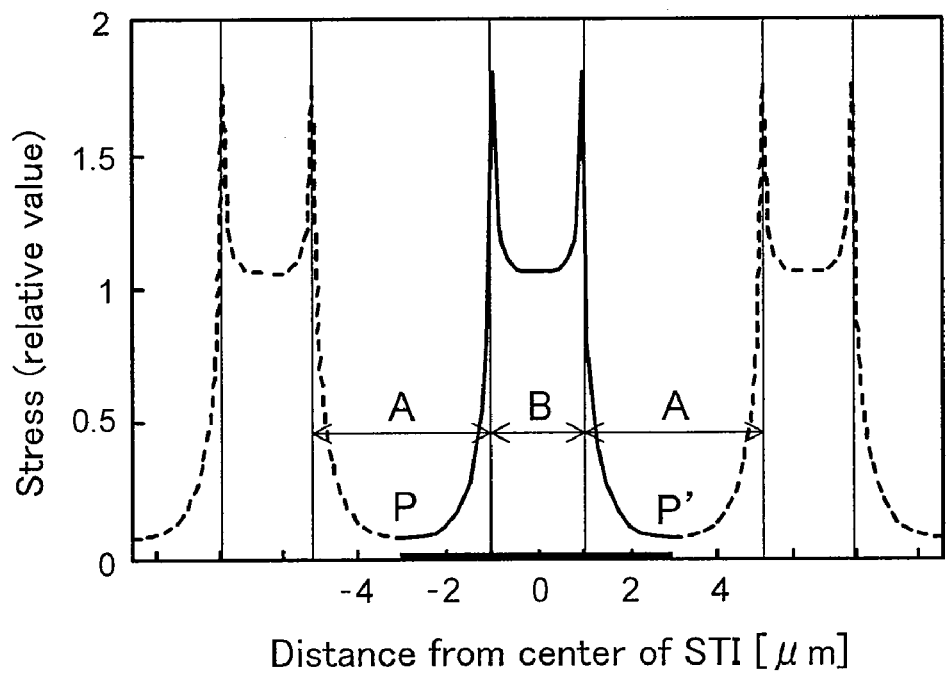

On the contrary, as shown in FIG. 2(b), when a side of the element isolation section 13 is formed in the <00-1> direction according to the present invention, the photoelectric conversion section 10 (region A) having a sufficiently reduced stress can be attained even though the distance between the opposite element isolation portions is 4 μm or less.

As described earlier, in the MOS solid-state imaging device, the pixel units each composed of a photodiode and the like arranged two-dimensionally and drive circuits (shift registers and the like) for driving MOS transistors in the pixel units can be formed in the same substrate.

Figure 8:
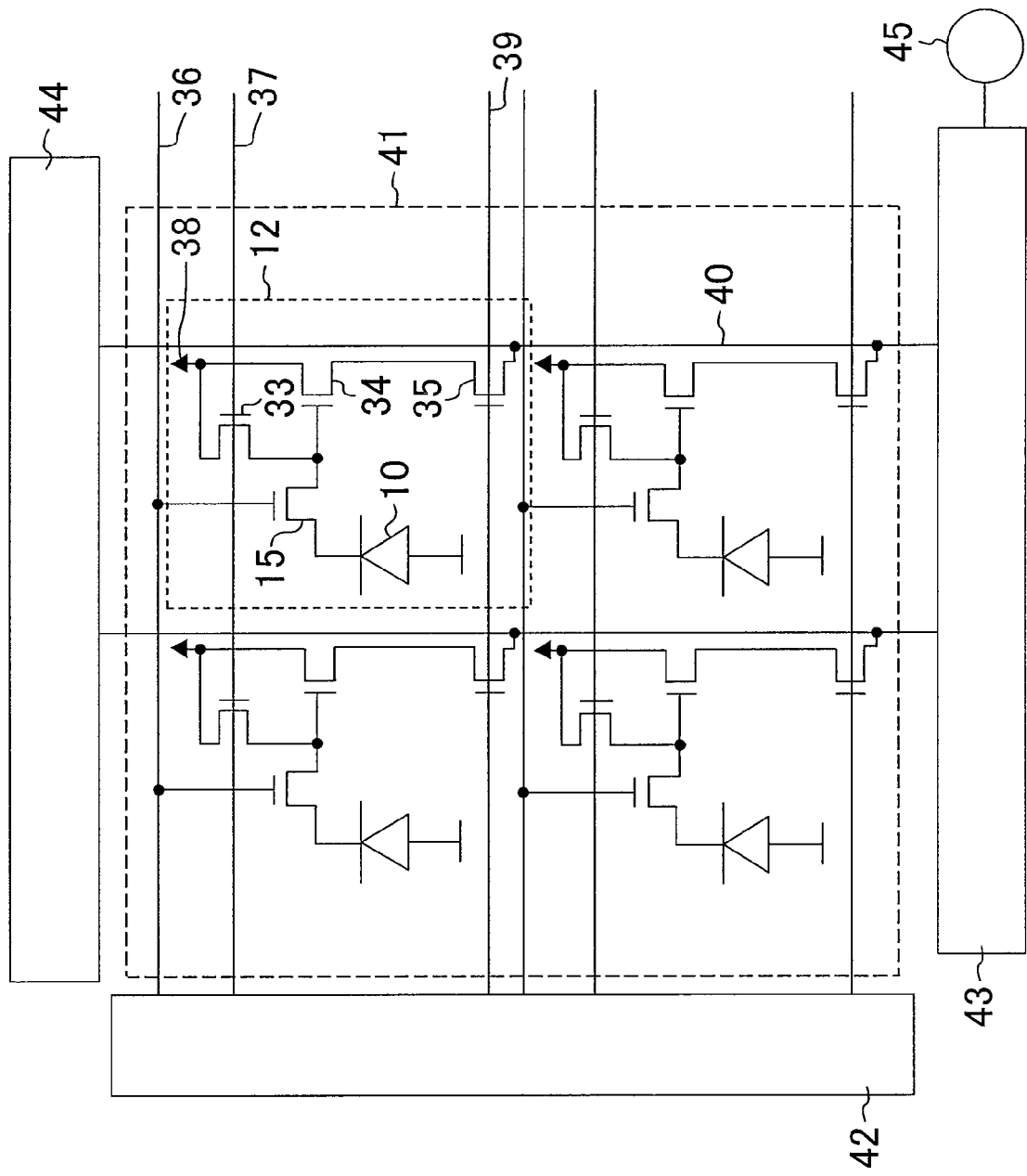
FIG. 8 is a circuit diagram of the solid-state imaging device of the embodiment of the present invention.
Figure 9:
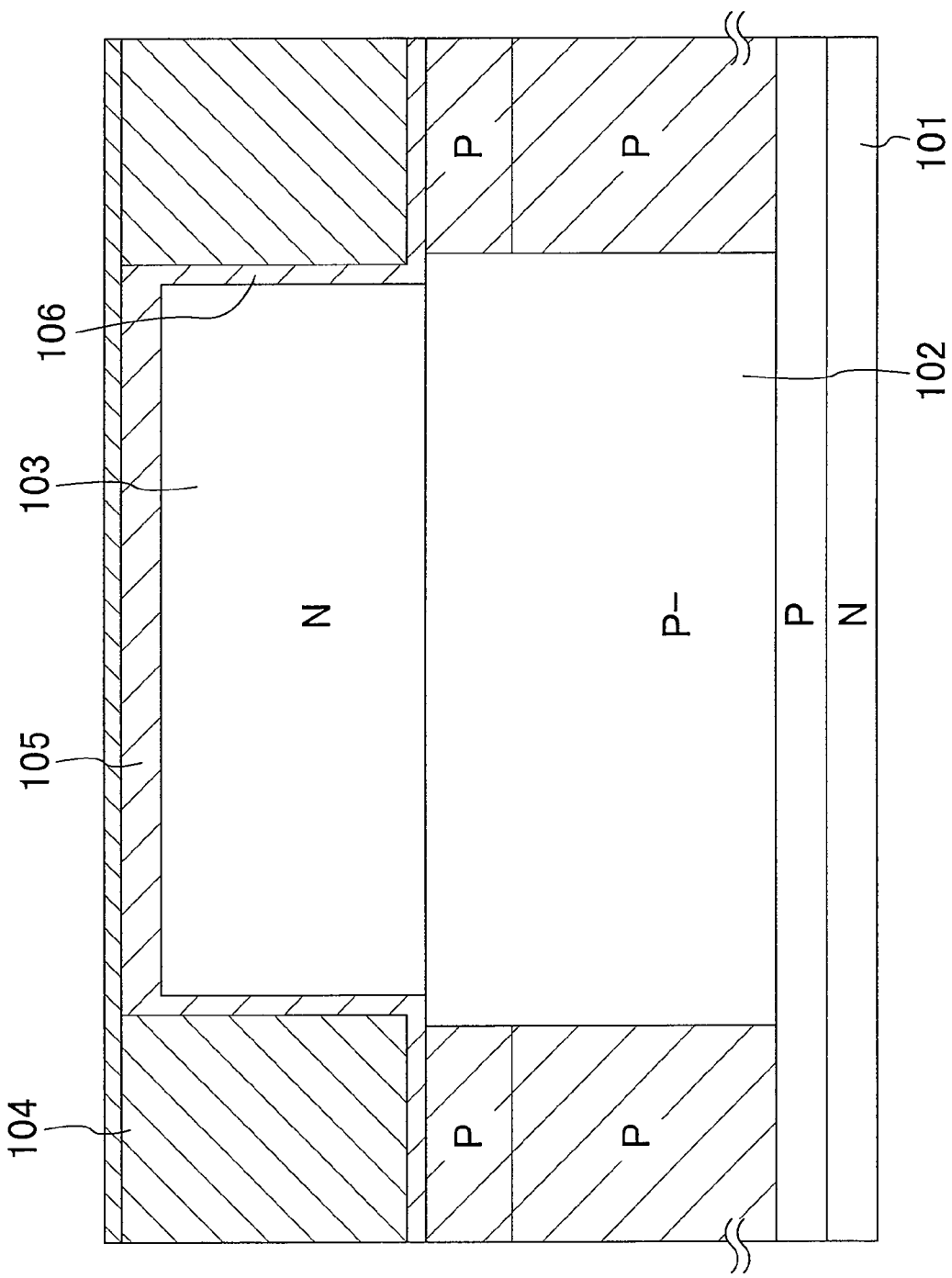
FIG. 9 is a cross-sectional view showing a configuration of a conventional solid-state imaging device.

FIG. 8 is a circuit diagram showing a configuration of such a solid-state imaging device. Hereinafter, the configuration of the pixel units and the drive circuits will be described with reference to FIG. 8.

On the silicon substrate, formed are an imaging region 41 having a plurality of pixel units 12 arranged in a matrix, a vertical shift register 42 for selecting the pixel units 12, a horizontal shift register 43 for outputting signals from the pixel units 12 and a timing generation circuit 44 for supplying pulses required for the vertical shift register 42 and the horizontal shift register 43.

Each of the pixel units 12 is composed of the photoelectric conversion section 10 made of a photodiode, the transfer transistor 15 for transferring signal charge generated in the photoelectric conversion section 10 to the floating diffusion layer (not shown), a reset transistor 33 for resetting the photoelectric conversion section 10 and the floating diffusion layer, an amplifier transistor 34 for amplifying the signal charge and a selection transistor 35. The signal charge generated in the photoelectric conversion section 10 is transferred to the floating diffusion layer via the transfer transistor 15, further transmitted to a vertical output signal line 40 via the amplifier transistor 34 and the selection transistor 35, to be outputted to an output terminal 45.

The reset transistor 33 has a drain connected to power supply 38 and a source shared with the floating diffusion layer. The amplifier transistor 34 has a drain connected to the power supply 38, a gate connected to the floating diffusion layer and a source connected to the drain of the selection transistor 35. The selection transistor 35 has a source connected to the vertical output signal line 40. The gates of the transfer transistor 15, the reset transistor 33 and the selection transistor 35 are respectively connected to output pulse lines 36, 37 and 39 extending from the vertical shift register 42.

Note that the transistors 15, 33, 34 and 35 constituting each pixel unit 12 and transistors constituting the vertical shift register 42, the horizontal shift register 43 and the timing generation circuit 44 are MOS transistors including at least n-channel MOS transistors.

The photoelectric conversion section according to the present invention is formed so that the crystal orientation of its side in contact with the element isolation section is <00-1>. When the photoelectric conversion section is a rectangle, for example, this can be easily attained by using a silicon substrate having a notch whose crystal orientation is <00-1> and placing the photoelectric conversion section in parallel with the notch direction. In this relation, the MOS transistors formed on the same substrate are also placed in parallel with or vertical to the notch direction. Hence, the crystal orientation of the channels is naturally <00-1>.

In the solid-state imaging device described above, the drive circuits (shift registers and the like) for driving the MOS transistors in the pixel units were formed on the same substrate. A signal processing section for processing pixel signals detected in the pixel units can also be formed on the same substrate. In this case, the signal processing section is composed of MOS transistors including at least n-channel MOS transistors, and the crystal orientation of the channels of such n-channel MOS transistors are <00-1>.

A preferred embodiment of the present invention has been described. It should however be noted that the above description is not restrictive but can be varied in various ways. For example, although STI was adopted as the structure of the element isolation section in this embodiment, substantially the same effect can also be obtained by adopting a LOCOS structure. It should also be noted that, according to the present invention, the <01-1> direction includes <0-1-1> direction, <0-11> direction and <011> direction.

INDUSTRIAL APPLICABILITY

The solid-state imaging device of the present invention is useful as a high-sensitive, small solid-state imaging device, and can be suitably used for image input devices and the like of mobile equipment as a solid-state imaging device equipped with a signal processing section.

The invention claimed is:

1. A solid-state imaging device having a plurality of pixel units formed on a silicon substrate,
   wherein a photoelectric conversion section constituting each of the pixel units is electrically isolated by being surrounded with an element isolation section made of an insulating film formed in the silicon substrate, and
   the crystal orientation of a major side, among sides of a plane shape of the photoelectric conversion section defined with the element isolation section that are in contact with the element isolation section, is made equivalent to <00-1>.

2. The solid-state imaging device of claim 1, wherein the major side of the plane shape of the photoelectric conversion section includes at least the longest side among the sides in contact with the element isolation section.

3. The solid-state imaging device of claim 1, wherein the plane shape of the photoelectric conversion section is a rectangle, and the crystal orientation of each side of is the rectangle is equivalent to <00-1>.

4. The solid-state imaging device of claim 1, wherein a signal processing section for processing pixel signals detected in the pixel units is formed on the same silicon substrate, and
   the signal processing section comprises a MOS transistor including at least an n-channel MOS transistor, and the crystal orientation of a channel of the n-channel MOS transistor is made equivalent to <00-1>.

5. The solid-state imaging device of claim 1, wherein the photoelectric conversion section comprises a buried photodiode with a high-density impurity surface layer formed in a surface portion of the silicon substrate, and
   a high-density impurity buried layer of a same conductivity type as the high-density impurity surface layer is formed in a boundary region between the photoelectric conversion section and the element isolation section in the silicon substrate.

6. The solid-state imaging device of claim 1, wherein the element isolation section has a configuration that a groove formed in the silicon substrate is filled with the insulating film.

7. The solid-state imaging device of claim 1, wherein the photoelectric conversion section is formed in a predetermined region in the silicon substrate, the predetermined region having a distance between opposite portions of the element isolation section of 4 μm or less.

8. The solid-state imaging device of claim 1, wherein the pixel unit further comprises a floating diffusion layer to which charge generated in the photoelectric conversion section is transferred, and the floating diffusion layer is electrically isolated with the element isolation section, and the crystal orientation of at least one side, among sides of a plane shape of the floating diffusion layer defined with the element isolation section that are in contact with the element isolation section, is made equivalent to <00-1>.

9. The solid-state imaging device of claim 8, wherein the plane shape of the floating diffusion layer is a rectangle, and the crystal orientation of each side of the rectangle is equivalent to <00-1>.

10. The solid-state imaging device of claim 8, wherein the pixel unit further comprises a transfer transistor for transferring charge generated in the photoelectric conversion section to the floating diffusion layer, and the crystal orientation of a channel of the transfer transistor is made equivalent to <00-1>.

11. The solid-state imaging device of claim 1, wherein the major side of the plane shape of the photoelectric conversion section does not include a side provided at a corner of the plane shape.

* * * * *